United States Patent
Chang et al.

(10) Patent No.: US 8,247,322 B2
(45) Date of Patent: Aug. 21, 2012

(54) VIA/CONTACT AND DAMASCENE STRUCTURES AND MANUFACTURING METHODS THEREOF

(75) Inventors: Shih-Chieh Chang, Shanhua Township (TW); Ying-Lang Wang, Lung-Jing (TW); Kei-Wei Chen, Taipei (TW); Jung-Chih Tsao, Taipei (TW); Yu-Sheng Wang, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 859 days.

(21) Appl. No.: 11/680,981

(22) Filed: Mar. 1, 2007

(65) Prior Publication Data
US 2008/0211106 A1    Sep. 4, 2008

(51) Int. Cl.
*H01L 21/44* (2006.01)
(52) U.S. Cl. .......... 438/639; 257/E23.141; 257/E21.495
(58) Field of Classification Search .................. 438/639; 257/E23.141, E21.495
See application file for complete search history.

(56) References Cited

U.S. PATENT DOCUMENTS

| | | | |
|---|---|---|---|
| 5,447,887 A * | 9/1995 | Filipiak et al. | 438/644 |
| 5,818,071 A | 10/1998 | Loboda et al. | |
| 6,348,733 B1 | 2/2002 | Lin | |
| 6,417,098 B1 * | 7/2002 | Wong et al. | 438/638 |
| 6,486,059 B2 | 11/2002 | Lee et al. | |
| 6,800,551 B2 * | 10/2004 | Nagahara et al. | 438/638 |
| 6,911,394 B2 | 6/2005 | Jiang et al. | |
| 6,989,604 B1 * | 1/2006 | Woo et al. | 257/774 |
| 7,074,698 B2 | 7/2006 | Morita et al. | |
| 2002/0140101 A1 | 10/2002 | Yang et al. | |
| 2002/0155695 A1 | 10/2002 | Lee et al. | |
| 2002/0197852 A1 | 12/2002 | Yeh et al. | |

FOREIGN PATENT DOCUMENTS

| | | |
|---|---|---|
| CN | 1396647 A | 2/2003 |
| CN | 1411040 A | 4/2003 |
| CN | 1575515 A | 2/2005 |

OTHER PUBLICATIONS

Official Action issued by the Chinese Patent Office on Jun. 28, 2010.

* cited by examiner

*Primary Examiner* — Matthew Reames
(74) *Attorney, Agent, or Firm* — Duane Morris LLP (57) ABSTRACT

A method for forming a semiconductor structure includes forming a dielectric layer over a substrate. A first non-conductive barrier layer is formed over the dielectric layer. At least one opening is formed through the first non-conductive barrier layer and within the dielectric layer. A second non-conductive barrier layer is formed over the first non-conductive barrier layer and within the opening. At least a portion of the second non-conductive barrier layer is removed, thereby at least partially exposing a top surface of the first non-conductive barrier layer and a bottom surface of the opening, with the second non-conductive barrier layer remaining on sidewalls of the opening. A seed layer and conductive layer is then formed and a single polishing operation removes the seed layer and conductive layer.

16 Claims, 9 Drawing Sheets

VIA/CONTACT AND DAMASCENE STRUCTURES AND MANUFACTURING METHODS THEREOF

BACKGROUND OF THE INVENTION

1. Field of the Invention

The present invention relates, most generally, to semiconductor device manufacturing, and more particularly to via/contact and/or damascene structures and manufacturing methods for forming the same.

2. Description of the Related Art

With advances associated with electronic products, semiconductor technology has been widely applied in manufacturing memories, central processing units (CPUs), liquid crystal displays (LCDs), light emission diodes (LEDs), laser diodes and other devices or chipsets. In order to achieve high-integration and high-speed goals and keep up with the advances in electronic products, dimensions of semiconductor integrated circuits continue to shrink. In addition, low-k dielectric materials and low-resistance metallic materials are used for reducing parasitic capacitances and resistance-capacitance (RC) time delays in order to enhance speeds of integrated circuits.

Figure 1:
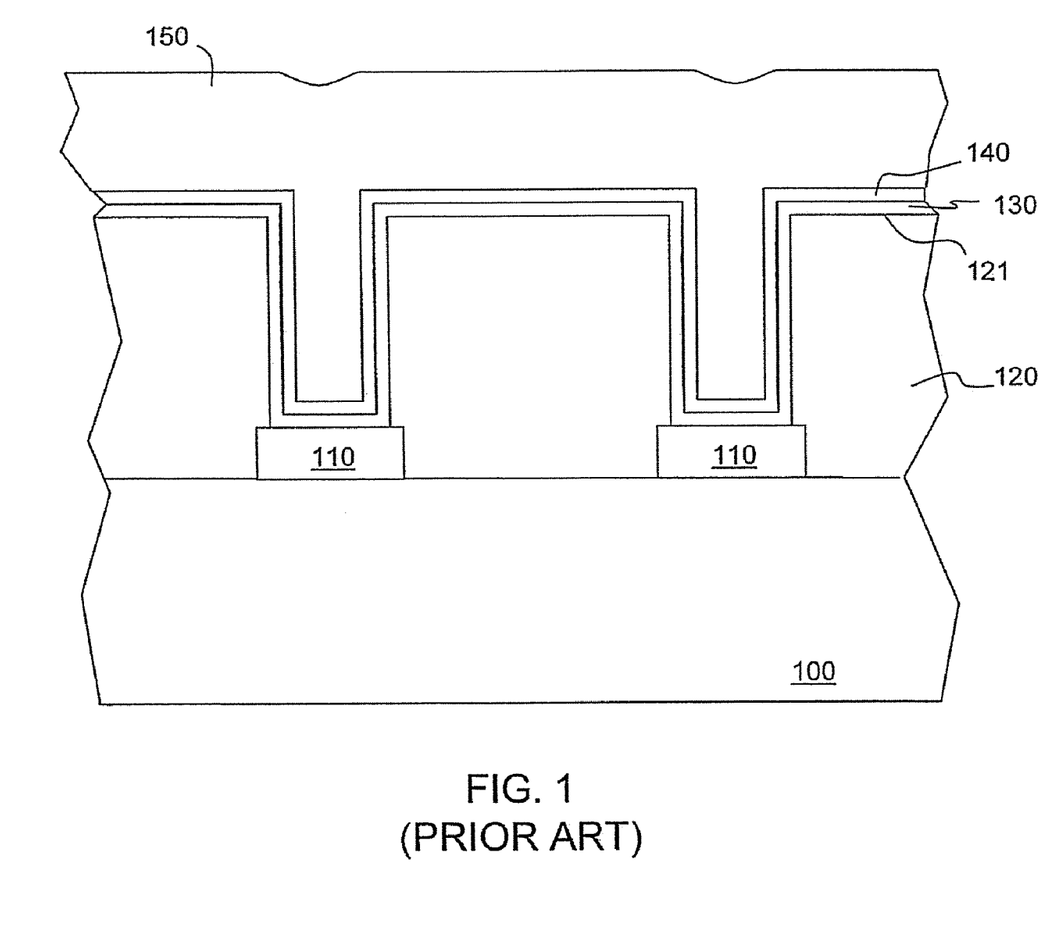
FIG. 1 is a side, cross-sectional view of an exemplary prior art via structure.

FIG. 1 is a cross-sectional view of a prior art semiconductor structure for forming a via structure.

Referring to FIG. 1, metal lines 110 are formed over a substrate 100. A dielectric layer 120 is formed on the substrate 100 and the metal lines 110. Holes (not labeled) are formed within the dielectric layer 120 and are via holes but may alternatively represent contact holes or trenches within which damascene leads are to be formed. A conductive diffusion barrier layer 130, e.g., a tantalum/tantalum nitride (Ta/TaN) diffusion barrier layer, is formed on the dielectric layer 120 and within the via holes. A copper seed layer 140 is formed on the Ta/TaN diffusion barrier layer 130. A copper layer 150 is formed on the copper seed layer 140 and fills in the via holes.

In order to isolate via structures formed in adjacent via holes, a chemical-mechanical polishing (CMP) process is used to remove the copper layer 150, the copper seed layer 140 and the Ta/TaN diffusion barrier layer 130 formed over the surface 121 of the dielectric layer 120. Since the material property of copper is different from that of Ta/TaN or other materials which may be used as the barrier layer 130, different recipes, slurries, polishing forces, pads or other factors of CMP process must be selected for individually removing the copper layer 150, the copper seed layer 140 and the Ta/TaN diffusion barrier layer 130 formed over the surface 121 of the dielectric layer 120.

Based on the foregoing, improved methods and structures for forming contact/via and/or damascene structures are desired.

SUMMARY OF THE INVENTION

In accordance with some exemplary embodiments, a method for forming a semiconductor structure includes forming a dielectric layer over a substrate. A first non-conductive barrier layer is formed over the dielectric layer. At least one opening is formed through the first non-conductive barrier layer and within the dielectric layer. A second non-conductive barrier layer is formed over the first non-conductive barrier layer and within the opening. At least a portion of the second non-conductive barrier layer is removed, thereby at least partially exposing a top surface of the first non-conductive barrier layer and a bottom surface of the opening.

In accordance with some exemplary embodiments, a semiconductor structure comprises a dielectric layer formed over a substrate. A plurality of openings are formed within the dielectric layer. A first non-conductive barrier layer is formed over the dielectric layer, wherein the first non-conductive barrier layer extends from an edge of a first one of the openings to an edge of a second one of the openings adjacent thereto. A second non-conductive barrier layer is formed on sidewalls of the openings. A conductive layer is formed within the openings.

The above and other features will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

DESCRIPTION OF THE PREFERRED EMBODIMENT

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus/device be constructed or operated in a particular orientation.

FIGS. 2A-2H are schematic cross-sectional views showing a sequence of processing operations in an exemplary method for forming a single damascene structure.

Figure 2A:
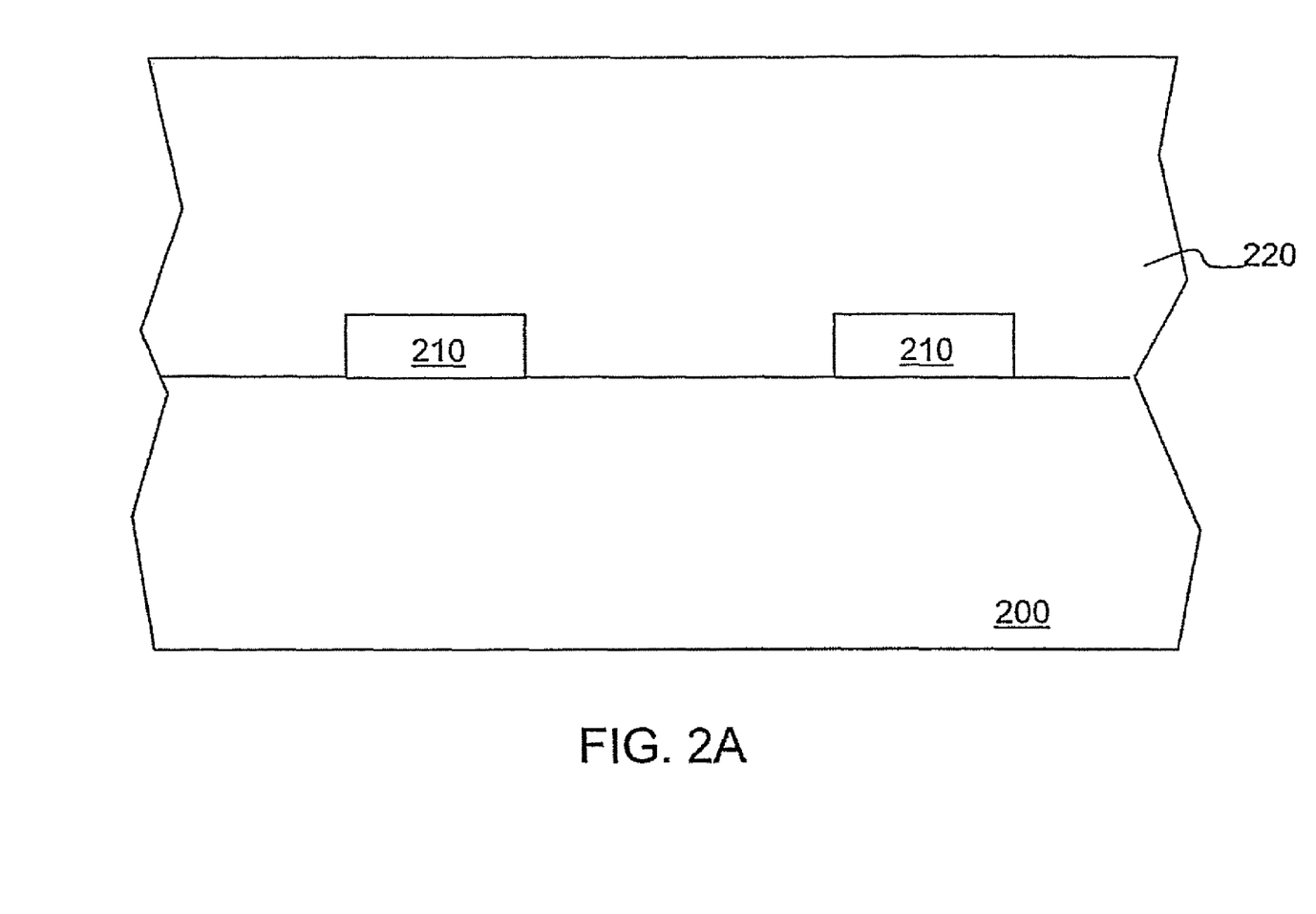
FIGS. 2A-2H are schematic cross-sectional views showing a sequence of operations in an exemplary method for forming a single damascene structure according to an embodiment of the invention.

Referring to FIG. 2A, conductive structures 210 are formed over a substrate 200, and a dielectric layer 220 is formed over the conductive structures 210 and the substrate 200. The substrate 200 can be a silicon substrate, a III-V compound substrate, a display substrate such as a liquid crystal display (LCD), plasma display, electro luminescence (EL) lamp display, or a light emitting diode (LED) substrate (collectively referred to as, substrate 200), for example. In some embodiments, the substrate 200 may include at least one of diodes, devices, transistors, circuits or combinations thereof (not shown) formed in and/or on the substrate 200.

The conductive structures 210 are formed and electrically coupled to at least one of diodes, devices, transistors, circuits or combinations thereof which may be formed in and/or on the substrate 200. The conductive structure 210 may comprise, for example, metal-containing lines such as aluminum lines, aluminum copper lines, aluminum silicon copper lines, copper lines, polysilicon lines, combinations thereof, or other suitable conductive materials.

Referring again to FIG. 2A, the dielectric layer 220 is formed over the conductive structures 210 and the substrate 200. The dielectric layer 220 may comprise, for example, a low-k dielectric layer (e.g., having a dielectric constant of about 3 or less, such as fluorinated amorphous carbon, fluorinated polyimides, and methyl-silsesquioxane, a carbon-containing material layer, a nitrogen-containing material layer, a porous low-k dielectric layer, an oxide layer, a nitride layer, an oxynitride layer, or combinations thereof. The dielectric layer 220 may be formed by, for example, a chemical vapor deposition (CVD) processing step, a spin-on processing step, or combination thereof. The dielectric layer 220 is provided to isolate conductive structures formed on different and/or the same layers. In some embodiments using 45-nm technology, the dielectric layer 220 may have a thickness between about 1000 Å and about 3000 Å, but other suitable thicknesses may be used in other exemplary embodiments.

Figure 2B:
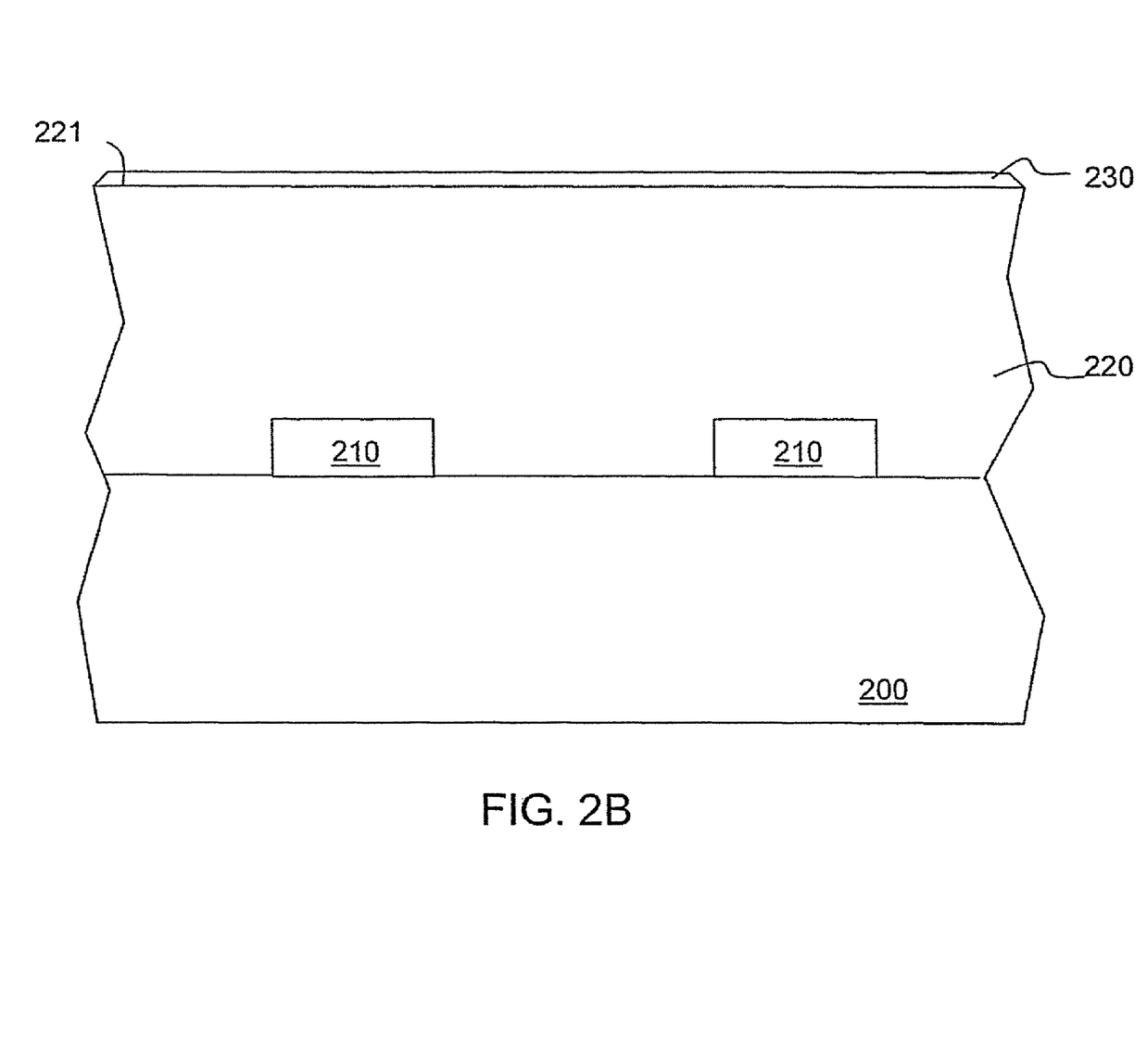

Referring to FIG. 2B, a non-conductive barrier layer 230 is formed over the top surface 221 of the dielectric layer 220. In some embodiments, the non-conductive barrier layer 230 may comprise a dielectric layer which may have, for example, a dielectric constant of about 7.0 or less, such as SixCy, SixNy, SixOyCz or SixOyNz. In some embodiments, the non-conductive barrier layer 230 may comprise at least one silicon-based material layer that includes at least one of nitrogen, oxygen and carbon. The silicon based material layer may comprise, for example, a carbon-containing silicon material layer, a silicon carbide layer, a carbon-doped silicon oxide layer, a silicon oxide layer, a silicon nitride layer, a silicon oxynitride layer, or combinations thereof. The non-conductive barrier layer 230 may be formed by a CVD processing step or other suitable deposition operations using a precursor comprising a silicon-containing gas such as silane (SiH4), tetraethyl-ortho-silicate oxide (TEOS), methylsilane (1MS), trimethylsilane (3MS), or tetramethylsilane (4MS) and a gas including a component selected from the group consisting of nitrogen, oxygen and carbon. In some embodiments, the gas may be NH3, N2, CO, CO2, O2 or the like, or combinations thereof. In some embodiments, the non-conductive barrier layer 230 may have a thickness between about 10 Å and about 200 Å.

Figure 2C:
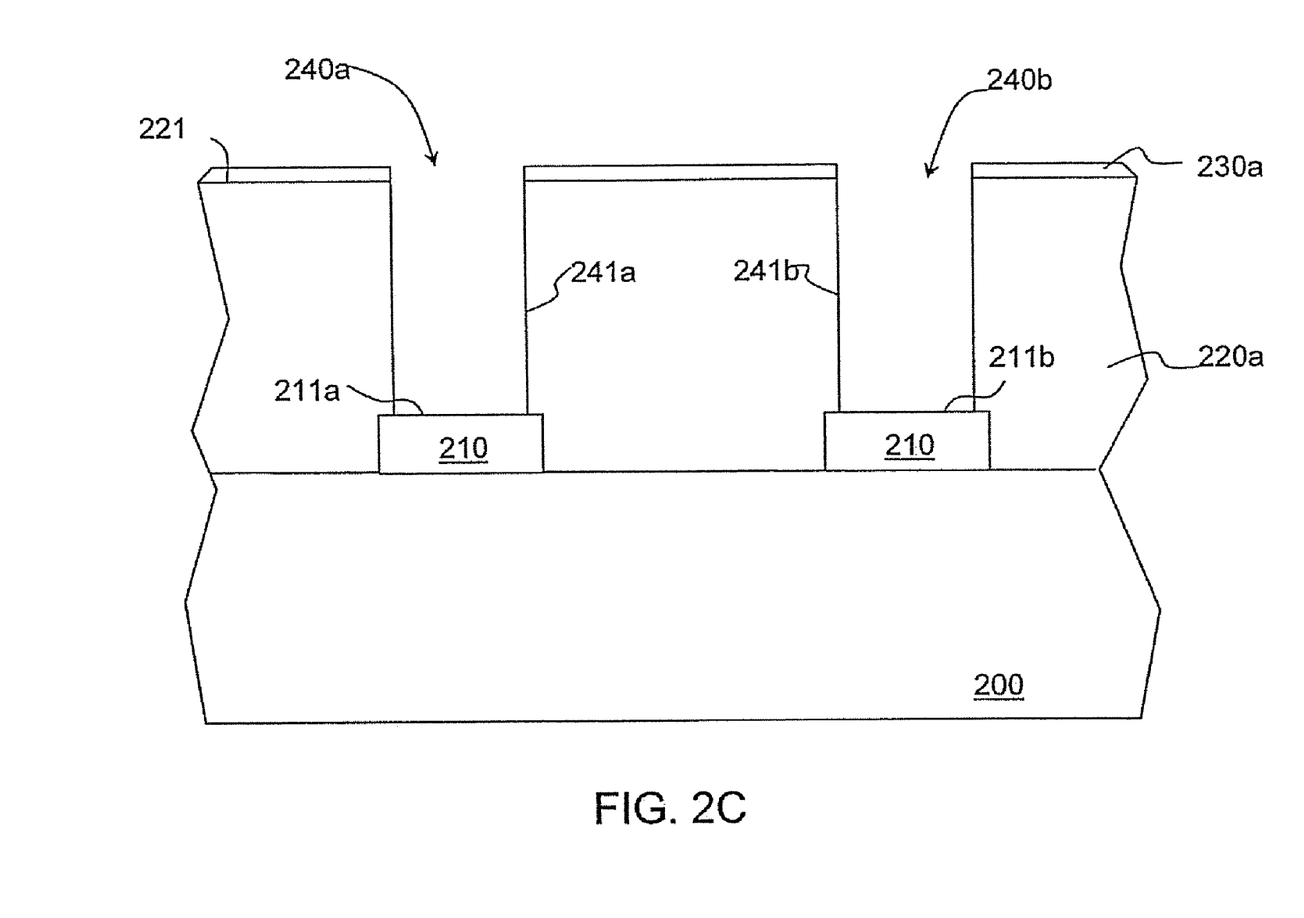

Referring to FIG. 2C, at least one opening e.g., openings 240a, 240b, are formed through the non-conductive barrier layer 230 and within the dielectric layer 220, thereby forming the non-conductive barrier layer 230a and the dielectric layer 220a. The openings 240a, 240b have sidewalls 241a, 241b and bottom surfaces 211a, 211b (i.e., the top surfaces of the conductive structures 210), respectively. The openings 240a, 240b may be, for example, contact openings, via openings, single damascene openings, dual damascene openings, or combinations thereof. In some exemplary embodiments and at other cross-sectional locations, openings 240a, 240b may terminate within the dielectric layer 220. In some embodiments using 45-nm technology, the openings 240a, 240b have an opening width between about 500 Å and about 800 Å. In some embodiments using 45-nm technology for forming a dual damascene, a dual damascene opening has a via opening width of about 65 nanometer (nm) or less and a trench opening width of about 90 nm or less. Openings having other widths may be used in other exemplary embodiments.

The openings 240a, 240b may be formed, for example, by forming a patterned photoresist layer (not shown) over the non-conductive barrier layer 230 and using a dry-etch processing step to remove portions of the non-conductive barrier layer 230 and the dielectric layer 220 to define the openings 240a, 240b by using the patterned photoresist layer (not shown) as a mask. Various suitable dry etch processes may be used. After the dry-etch processing step, the patterned photoresist layer (not shown) is removed by, for example, a photolithographic removal process.

Figure 2D:
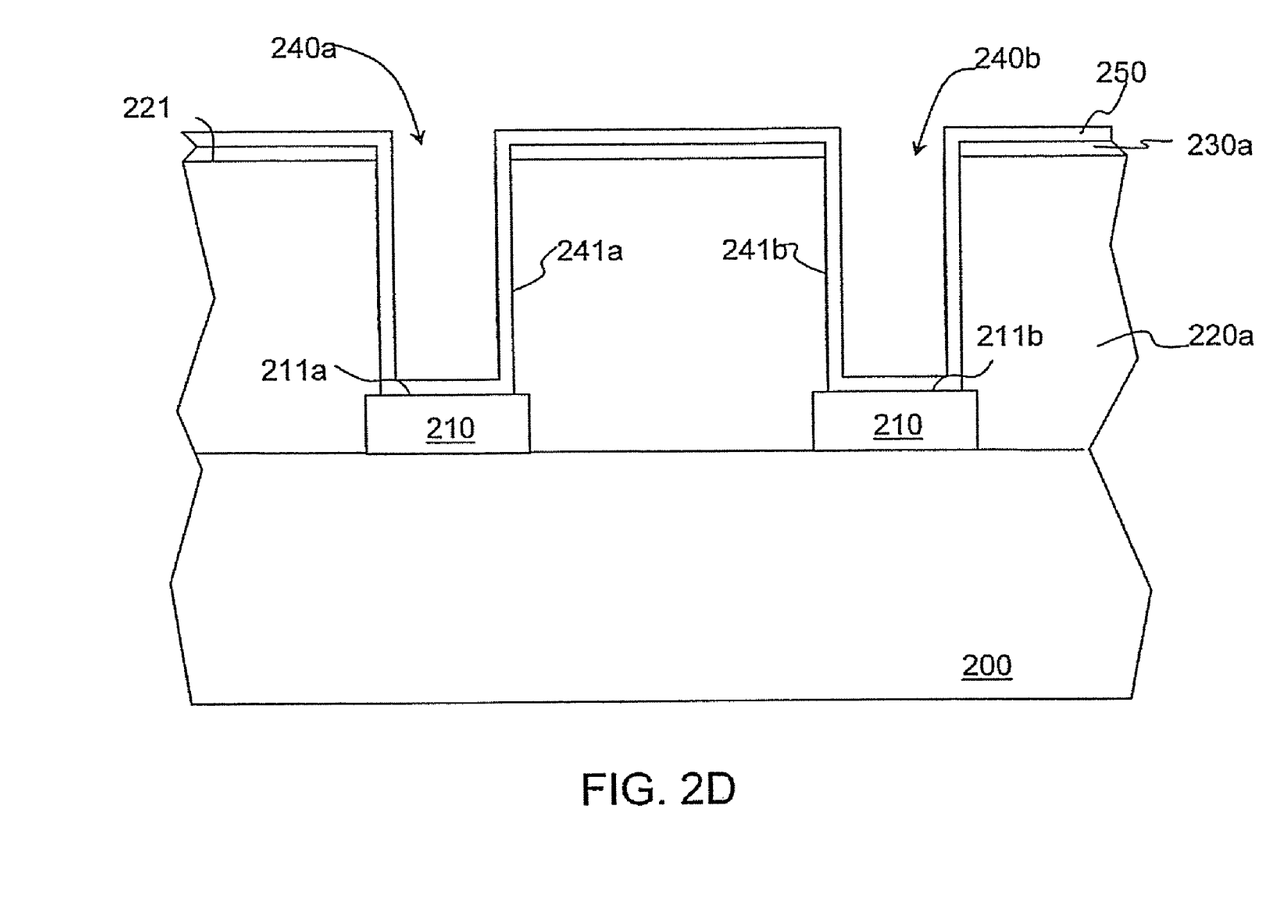

Referring to FIG. 2D, a non-conductive barrier layer 250 is formed substantially conformally over the structure of FIG. 2C. In some embodiments, the non-conductive barrier layer 250 may be a dielectric layer with a dielectric constant of about 7.0 or less, such as SixCy, SixNy, SixOyCz or SixOyNz. In some embodiments, the non-conductive barrier layer 250 may comprise at least one silicon-based material layer including at least one of nitrogen, oxygen and carbon. The silicon based material layer may comprise, for example, a carbon-containing silicon material layer, a silicon carbide layer, a carbon-doped silicon oxide layer, a silicon oxide layer, a silicon nitride layer, a silicon oxynitride layer, or combinations thereof. The substantially conformal non-conductive barrier layer 250 may be formed using CVD or other suitable processing operations. In some embodiments, the non-conductive barrier layer 250 may have a thickness between about 10 Å and about 200 Å but may be formed to other thicknesses in other exemplary embodiments.

In some embodiments, the non-conductive barrier layers 230 and 250 may be formed of the same material. In some embodiments, the non-conductive barrier layers 230 and 250 may have substantially the same thickness.

Figure 2E:
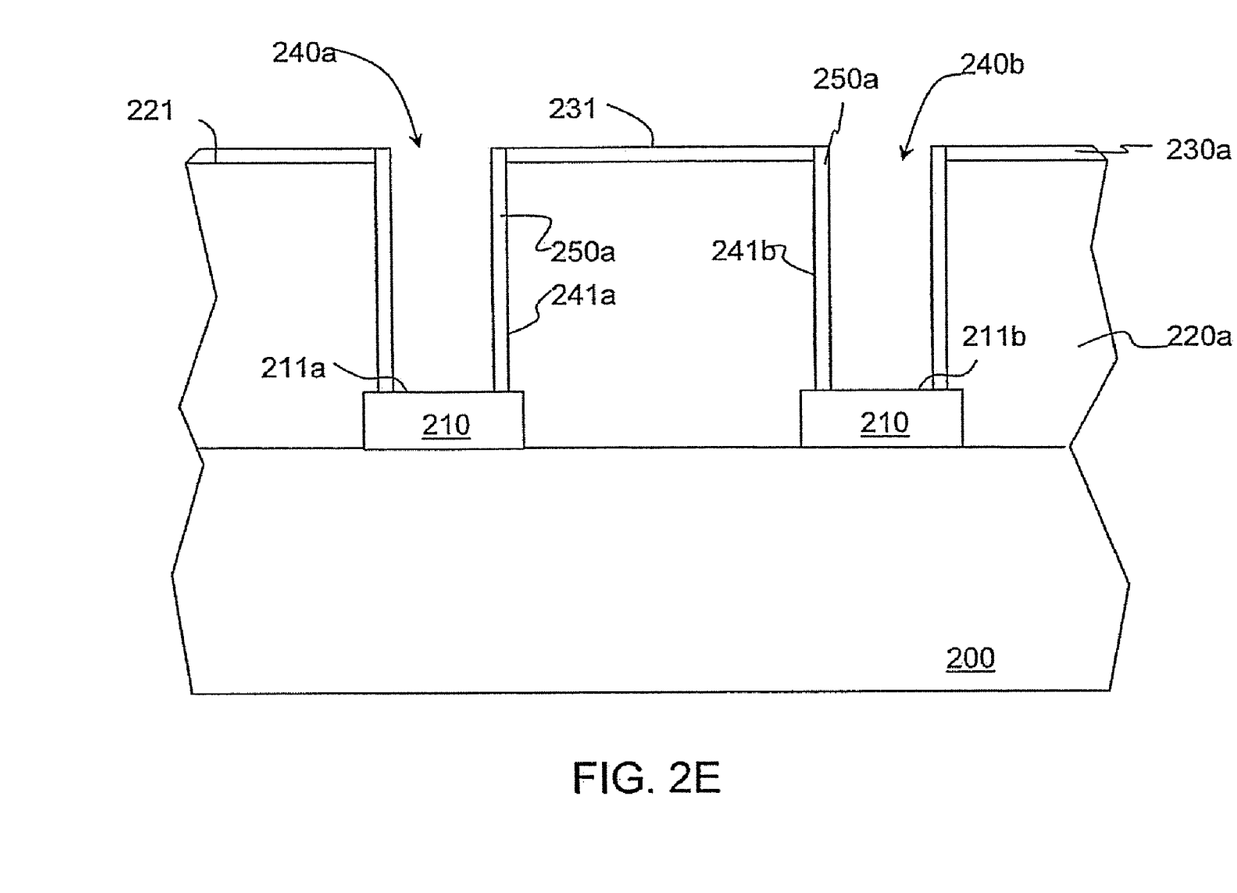

Referring to FIG. 2E, at least a portion of the non-conductive barrier layer 250 is removed, thereby at least partially exposing a top surface 231 of the non-conductive barrier layer 230a and the bottom surfaces 211a, 211b of the openings 240a, 240b (i.e., the top surfaces of the conductive structures 210). The step of partially removing the non-conductive barrier layer 250 may comprise, for example, a dry-etch processing step. The dry etch processing step may be substantially anisotropic and may use a precursor comprising a fluorine-containing gas. In some embodiments, the fluorine-containing gas may comprise, for example, $C_xF_y$, $C_xF_yH_z$, $NF_3$, or $C_xF_yO_z$, where x ranges from 0 to 9, y ranges from 0 to 9 and z ranges from 0 to 9. After the dry etch processing step, the non-conductive barrier layers 250a remain on the sidewalls 241a, 241b of the openings 240a, 240b, and the top surfaces of the conductive structures 210 are exposed for electrical connection with other conductive structures (not shown).

In some embodiments, the non-conductive barrier layers 230 and 250 have substantially the same thickness. After the dry-etch processing step, the thickness of the non-conductive barrier layer 250a on the sidewalls 241a, 241b may be substantially equal to that of the non-conductive barrier layer 230a over the surface 221 of the dielectric layer 220a. In other embodiments, the thickness of the non-conductive barrier layer 250a may be larger or smaller than that of the non-conductive barrier layer 230a, as long as the non-conductive barrier layer 250 at the bottom surfaces 211a, 211b of the openings 240a, 240b is removed to expose the top surfaces of the conductive structures 210.

Figure 2F:
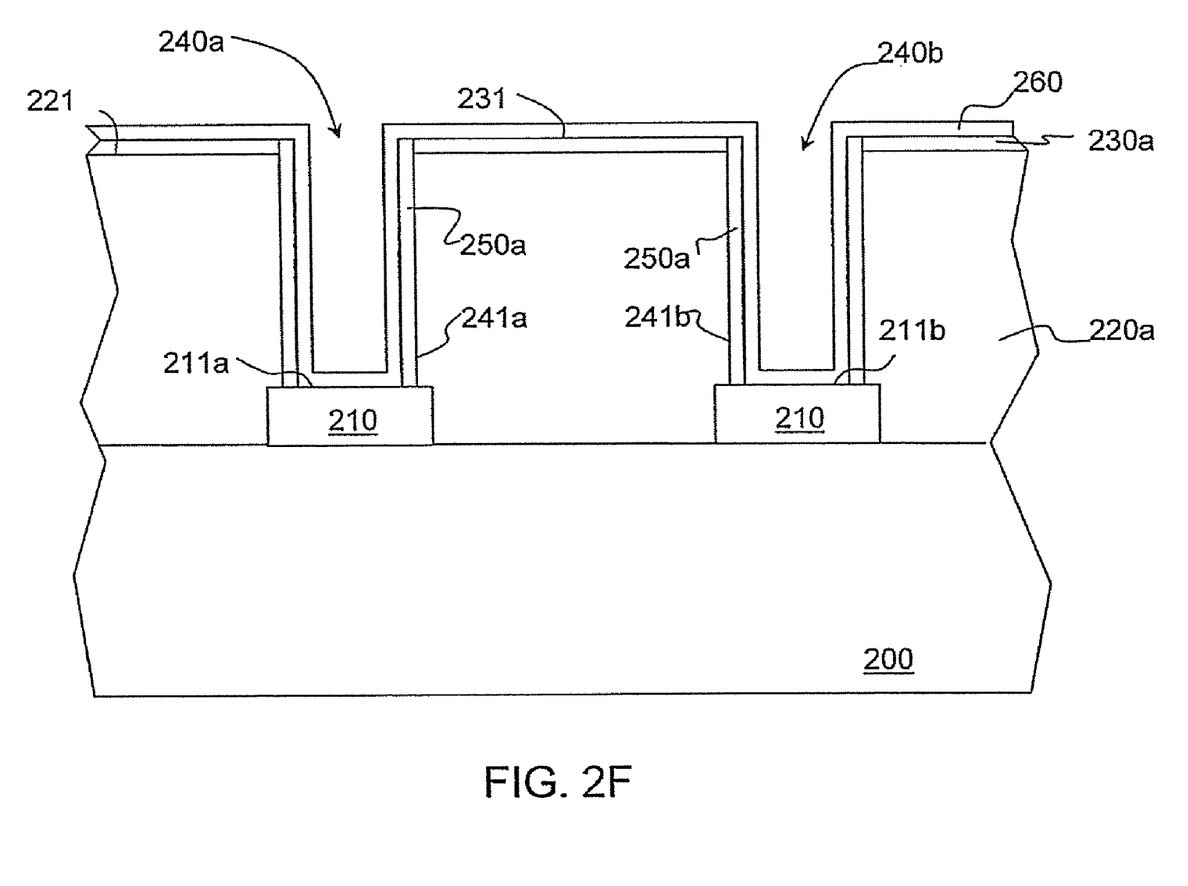

Referring to FIG. 2F, a substantially conformal seed layer 260 is formed over the structure of FIG. 2E. The seed layer 260 is over the top surfaces 231 of the non-conductive barrier layer 230a and the bottom surfaces 211a, 211b of the openings 240a, 240b. The seed layer 260 may be, for example, a metal-containing seed layer such as a copper seed layer. The seed layer 260 is formed to serve as a seed for the chemical electroplating of a subsequent conductive layer 270 (shown in FIG. 2G) over the seed layer 260. The seed layer 260 may be formed by, for example, a physical vapor deposition (PVD) processing step, a CVD processing step, an atomic layer deposition (ALD) processing step, a chemical electroplating step, a chemical electroless plating step, or various combinations thereof. In some embodiments using 45-nm technology, the seed layer 260 on the sidewalls 241a, 241b of the openings 240a, 240b has a thickness between about 100 Å and about 200 Å, and the seed layer 260 on the bottom surfaces 211a, 211b of the openings 240a, 240b has a thickness between about 400 Å and about 700 Å.

Figure 2G:
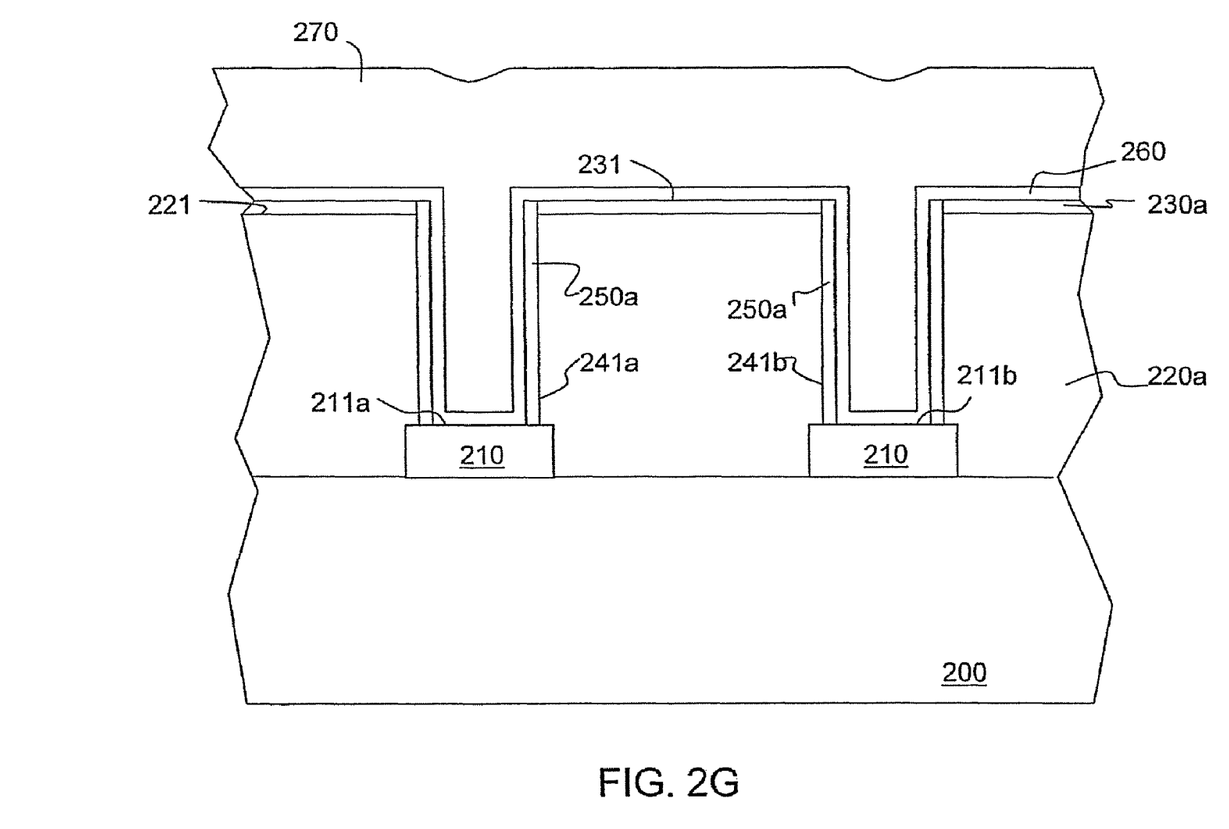

Referring to FIG. 2G, a conductive layer 270 is formed over the seed layer 260. The conductive layer 270 also fills the openings 240a, 240b. The conductive layer 270 may be formed, for example, by a PVD processing step, a CVD processing step, an ALD processing step, a chemical electroplating step, a chemical electroless plating step, or various combinations thereof. The conductive layer 270 may comprise a metal-containing layer such as a copper layer, a copper alloy layer, an aluminum layer, an aluminum alloy layer, an aluminum copper layer, an aluminum silicon copper layer or the combinations thereof.

In some embodiments, the step of forming the seed layer 260 may be omitted if the formation of the conductive layer 270 within the openings 240a, 240b and/or over the top surface 231 of the non-conductive barrier layer 230a can be desirably achieved without a seed layer.

Figure 2H:
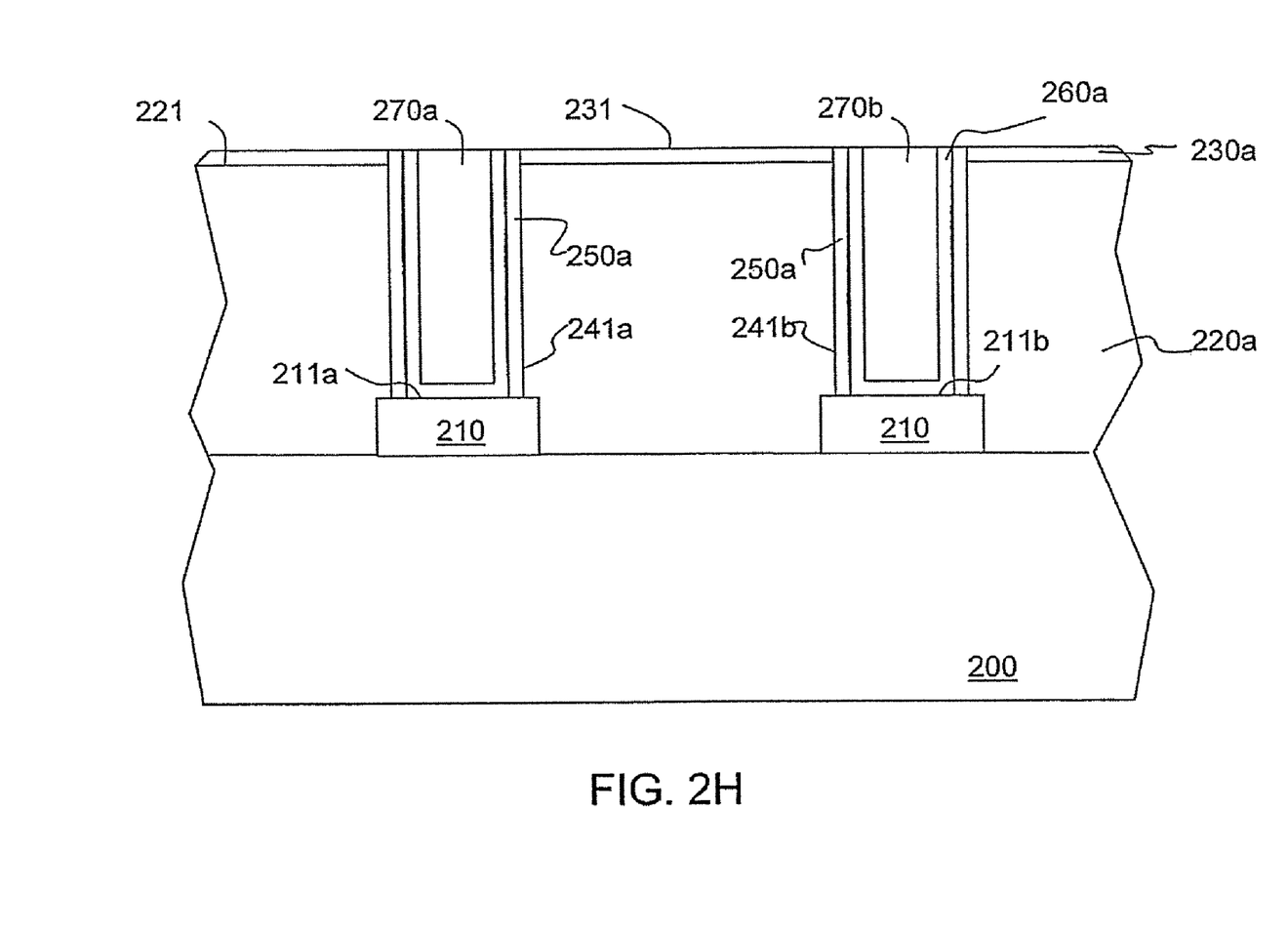

Referring to FIG. 2H, the conductive layer 270 and the seed layer 260 are partially removed, thereby at least partially exposing the top surfaces 231 of the non-conductive barrier layer 230a and forming the conductive layers 270a, 270b within the openings 240a, 240b. The step of partially removing the conductive layer 270 and the seed layer 260 may comprise, for example, a chemical-mechanical (CMP) processing step, an electropolishing step, a dry etch step, or combinations thereof.

If a conductive barrier layer (e.g., a Ta/TaN layer) is formed between the surface 221 of the dielectric layer 220a and the conductive layer 270 such as in conventional processing, a multi-step CMP process is required to remove the conductive layer 270, the seed layer 260 and the Ta/TaN barrier layer formed over the surface 221 of the dielectric layer 220a. In short, a separate CMP step is used to remove the Ta/TaN barrier layer formed over the dielectric layer 220a for isolating two adjacent contacts, vias and/or damascenes. However, if the dielectric layer 220a is a low-k dielectric layer, the CMP step for removing the Ta/TaN barrier layer may damage the low-k dielectric layer thereunder due to its porous and weak mechanical properties. For example, CMP forces may degrade electrical properties and/or reliabilities of the dielectric layer 220a.

According to the exemplary methods described in FIGS. 2A-2H, no conductive barrier layer (e.g., tantalum/tantalum nitride (Ta/TaN) layer) is formed between the top surface 221 of the dielectric layer 220a and the conductive layer 270. Accordingly, a single CMP process may remove the conductive layer 270 and the seed layer 260 formed over the top surfaces 231 of the non-conductive barrier layers 230a without an additional CMP step for removing the conductive barrier layer. In this manner, changing recipes, slurries, chemicals, or combinations thereof for removing a conductive barrier layer can be avoided. After polishing, top surfaces 231 remain and the underlying dielectric layer 220a is less susceptible to being damaged.

In some embodiments, the conductive layer 270 and the seed layer 260 are the same material. A single chemical electropolishing step may be used to remove the conductive layer 270 and the seed layer 260 formed over the top surfaces 231 of the non-conductive barrier layers 230a. By the exemplary methods set forth above in connection with FIGS. 2A-2H, no additional CMP step or electropolishing is needed for removing a conductive barrier layer formed between the top surface 221 of the dielectric layer 220a and the conductive layer 270. Accordingly, damage to the dielectric layer 220a caused by the CMP step for removing a conductive barrier layer is prevented or reduced.

Referring again to FIG. 2F, the non-conductive barrier layer 230a is formed over the dielectric layer 220a, extending from the sidewall 241a of the opening 240a to the sidewall 241b of the adjacent opening 240b. The non-conductive barrier layers 250a are formed along the sidewalls 241a, 241b from the top to the bottom of the openings 240a, 240b, respectively. The non-conductive barrier layers 230a, 250a are formed of materials that desirably prevent metallic diffusion from the seed layer 260a and/or the conductive layers 270a, 270b.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A method for forming a semiconductor structure, comprising:
    forming a dielectric layer over a substrate;
    forming a first non-conductive barrier layer over the dielectric layer;
    forming at least one opening through the first non-conductive barrier layer and within the dielectric layer, the first non-conductive barrier layer comprising a carbon-containing silicon material layer, a silicon carbide layer or a carbon-doped silicon oxide layer;
    forming a second non-conductive barrier layer over the first non-conductive barrier layer and within the opening;
    removing at least a portion of the second non-conductive barrier layer, thereby at least partially exposing a top surface of the first non-conductive barrier layer and a bottom surface of the opening;
    forming a conductive seed layer with a conductive lower surface directly on and contacting the top surface of the first non-conductive barrier layer and the bottom surface of the opening, the conductive seed layer formed of one of a copper layer, a copper alloy layer, an aluminum layer, an aluminum alloy layer, an aluminum copper layer, and an aluminum silicon copper layer; and
    forming a conductive layer directly on the conductive seed layer.

2. The method of claim 1, further comprising removing at least portions of the conductive layer and the conductive seed layer from over the top surface of the first non-conductive barrier layer using a chemical-mechanical polishing (CMP) step or an electropolishing step, thereby at least partially exposing the top surface of the first non-conductive barrier layer.

3. The method of claim 1, wherein the second non-conductive barrier layer remains on sidewalls of the opening during the step of removing at least a portion of the second non-conductive barrier layer.

4. The method of claim 1, wherein the step of removing at least a portion of the second non-conductive barrier layer includes a dry etch step.

5. The method of claim 4, wherein the dry etch step is anisotropic in nature and uses a precursor comprising a fluorine-containing gas.

6. The method of claim 5 wherein the fluorine-containing gas comprises at least one of $C_xF_y$, $C_xF_yH_z$, $NF_3$ and $C_xF_yO_z$, where x ranges from 0 to 9, y ranges from 0 to 9 and z ranges from 0 to 9.

7. The method of claim 1, wherein at least one of the step of forming a first non-conductive barrier layer and the step of forming a second non-conductive barrier layer uses a precursor comprising a silicon-containing gas and a gas including a component selected from the group consisting of nitrogen, oxygen and carbon.

8. A method for forming a semiconductor structure, comprising:
   forming a low-k dielectric layer over a substrate;
   forming a first dielectric barrier layer over the low-k dielectric layer;
   forming at least one opening through the first dielectric barrier layer and within the low-k dielectric layer, the first dielectric barrier layer comprising a carbon-containing silicon material layer, a silicon carbide layer or a carbon-doped silicon oxide layer;
   forming a second dielectric barrier layer over the first dielectric barrier layer and within the opening;
   removing at least a portion of the second dielectric barrier layer, thereby at least partially exposing a top surface of the first dielectric barrier layer and a bottom surface of the opening;
   forming a conductive seed layer with a conductive lower surface directly on and contacting the top surface of the first dielectric barrier layer and the bottom surface of the opening, the conductive seed layer formed of one of a copper layer, a copper alloy layer, an aluminum layer, an aluminum alloy layer, an aluminum copper layer, and an aluminum silicon copper layer;
   forming a metal-containing layer directly on the conductive seed layer; and
   partially removing at least portions of the metal-containing layer and the conductive seed layer, thereby at least partially exposing the top surface of the first non-conductive barrier layer.

9. The method of claim 8 wherein the step of partially removing at least portions of the metal-containing layer and the conductive seed layer comprises a chemical-mechanical polishing (CMP) step or an electropolishing step.

10. The method of claim 8 wherein the second dielectric barrier layer remains on sidewalls of the opening during the step of removing at least a portion of the second dielectric barrier layer.

11. The method of claim 8 wherein the step of removing at least a portion of the second dielectric barrier layer includes a dry etch step.

12. The method of claim 11, wherein the dry etch step uses a precursor comprising a fluorine-containing gas.

13. The method of claim 12 wherein the fluorine-containing gas comprises at least one of $C_xF_y$, $C_xF_yH_z$, $NF_3$ and $C_xF_yO_z$, where x ranges from 0 to 9, y ranges from 0 to 9 and z ranges from 0 to 9.

14. The method of claim 8, wherein at least one of the step of forming a first dielectric barrier layer and the step of forming a second dielectric barrier layer uses a precursor comprising a silicon-containing gas and a gas including a component selecting from the group consisting of nitrogen, oxygen and carbon.

15. The method of claim 1, wherein the step of forming a first non-conductive barrier layer comprises using a precursor comprising a silicon-containing gas and a gas comprising one of CO and $CO_2$.

16. The method of claim 8, wherein the step of forming a first dielectric barrier layer comprises using a precursor comprising a silicon-containing gas and a gas comprising one of CO and $CO_2$.

* * * * *